(12) United States Patent
Doczy et al.

(10) Patent No.: US 7,074,680 B2
(45) Date of Patent: Jul. 11, 2006

(54) METHOD FOR MAKING A SEMICONDUCTOR DEVICE HAVING A HIGH-K GATE DIELECTRIC

(75) Inventors: Mark L. Doczy, Beaverton, OR (US); Gilbert Dewey, Hillsboro, OR (US); Suman Datta, Beaverton, OR (US); Sangwoo Pae, Beaverton, OR (US); Justin K. Brask, Portland, OR (US); Jack Kavalieros, Portland, OR (US); Matthew V. Metz, Hillsboro, OR (US); Adrian B. Sherrill, Portland, OR (US); Markus Kuhn, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/935,784

(22) Filed: Sep. 7, 2004

(65) Prior Publication Data

US 2006/0051880 A1    Mar. 9, 2006

(51) Int. Cl.
    *H01L 21/336* (2006.01)
(52) U.S. Cl. .................................... 438/287
(58) Field of Classification Search ............... 438/142, 438/197, 199, 211, 216, 218, 240, 261, 263, 438/264, 585, 591–594, 287; 257/410–412, 257/310
    See application file for complete search history.

(56) References Cited

U.S. PATENT DOCUMENTS

| 6,063,698 | A | 5/2000 | Tseng et al. ............. 438/585 |
| 6,171,900 | B1 * | 1/2001 | Sun ..................... 438/240 |
| 6,184,072 | B1 | 2/2001 | Kaushik et al. ............. 438/197 |
| 6,255,698 | B1 | 7/2001 | Gardner et al. ............. 257/369 |
| 6,365,450 | B1 | 4/2002 | Kim ..................... 438/216 |
| 6,410,376 | B1 | 6/2002 | Ng et al. ................. 438/199 |
| 6,420,279 | B1 | 7/2002 | Ono et al. ................ 438/785 |
| 6,475,874 | B1 | 11/2002 | Xiang et al. ............... 438/396 |
| 6,514,828 | B1 | 2/2003 | Ahn et al. ................ 438/240 |
| 6,544,906 | B1 | 4/2003 | Rotondaro et al. .......... 438/785 |
| 6,586,288 | B1 | 7/2003 | Kim et al. ................ 438/183 |
| 6,617,209 | B1 | 9/2003 | Chau et al. ............... 438/240 |
| 6,617,210 | B1 | 9/2003 | Chau et al. ............... 438/240 |
| 6,620,713 | B1 | 9/2003 | Arghavani et al. .......... 438/585 |
| 6,689,675 | B1 | 2/2004 | Parker et al. ............. 438/585 |
| 6,696,327 | B1 | 2/2004 | Brask et al. .............. 438/197 |
| 6,696,345 | B1 | 2/2004 | Chau et al. ............... 438/387 |

(Continued)

FOREIGN PATENT DOCUMENTS

EP     0 899 784 AZ     3/1999

(Continued)

OTHER PUBLICATIONS

Polishchuk et al., "Dual Workfunction CMOS Gate Technology Based on Metal Interdiffusion", www.eesc.berkeley.edu, 1 page, date not known.

(Continued)

*Primary Examiner*—Brook Kebede
(74) *Attorney, Agent, or Firm*—Blakely, Sokoloff, Taylor & Zafman LLP

(57) ABSTRACT

A method for making a semiconductor device is described. That method comprises forming an oxide layer on a substrate, and forming a high-k dielectric layer on the oxide layer. The oxide layer and the high-k dielectric layer are then annealed at a sufficient temperature for a sufficient time to generate a gate dielectric with a graded dielectric constant.

20 Claims, 2 Drawing Sheets

U.S. PATENT DOCUMENTS

| | | |
|---|---|---|
| 6,709,911 B1 | 3/2004 | Doczy et al. ............... 438/197 |
| 6,713,358 B1 | 3/2004 | Chau et al. |
| 6,716,707 B1 | 4/2004 | Brask et al. ................ 438/287 |
| 6,746,967 B1 | 6/2004 | Brask et al. ................ 438/752 |
| 6,770,568 B1 | 8/2004 | Brask et al. ................ 438/746 |
| 2002/0058374 A1 | 5/2002 | Kim et al. .................. 438/228 |
| 2002/0086504 A1 | 7/2002 | Park et al. .................. 438/580 |
| 2002/0197790 A1 | 12/2002 | Kizilyalli et al. ........... 438/240 |
| 2003/0032303 A1 | 2/2003 | Yu et al. .................... 438/770 |
| 2003/0045080 A1 | 3/2003 | Visokay et al. ............ 438/591 |
| 2003/0057432 A1* | 3/2003 | Gardner et al. ............ 257/100 |
| 2004/0087124 A1 | 5/2004 | Kubota et al. |
| 2004/0188762 A1* | 9/2004 | Shimamoto et al. ....... 257/350 |
| 2005/0074978 A1 | 4/2005 | Wang et al. |
| 2005/0081781 A1* | 4/2005 | Lin et al. .................... 117/104 |

FOREIGN PATENT DOCUMENTS

GB      2 358 737 A      4/2001

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages, date not known.

\* cited by examiner

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials can reduce gate leakage. To ensure acceptable transistor performance, it may be necessary to form a transition oxide between the underlying substrate (e.g., a silicon wafer) and the high-k dielectric layer. If, however, there is an abrupt dielectric constant transition between the interfacial oxide and the high-k dielectric, the resulting film may be unreliable. A transistor with such a film may have an unstable threshold voltage (Vt) if the transition oxide breaks down quickly, when subjected to an applied field.

Accordingly, there is a need for an improved process for making a semiconductor device that includes a high-k gate dielectric. There is a need for a process for forming a gate dielectric that does not show a sharp dielectric constant transition between a high-k dielectric and an interfacial oxide. The method of the present invention provides such a process.

Features shown in these figures are not intended to be drawn to scale.

DETAILED DESCRIPTION OF THE PRESENT INVENTION

A method for making a semiconductor device is described. That method comprises forming an oxide layer on a substrate and forming a high-k dielectric layer on the oxide layer. The oxide layer and the high-k dielectric layer are then annealed at a sufficient temperature for a sufficient time to generate a gate dielectric with a graded dielectric constant. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
FIGS. 1a–1c represent cross-sections of structures that may be formed when carrying out an embodiment of the method of the present invention.
Figure 1B:
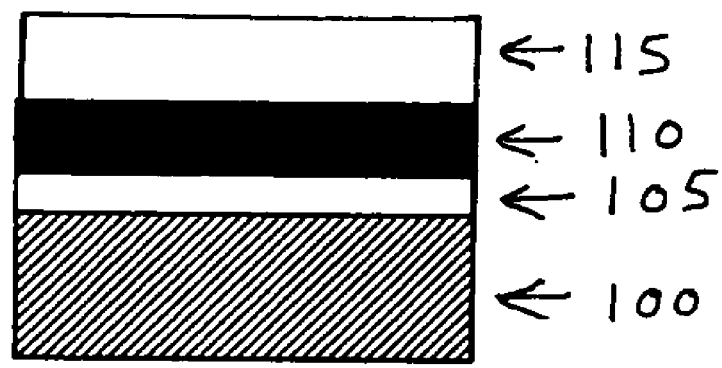
Figure 1C:
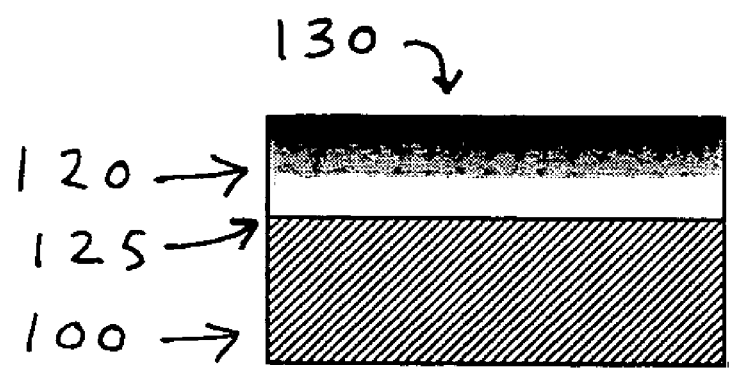

FIGS. 1a–1c represent cross-sections of structures that may be formed when carrying out an embodiment of the method of the present invention. In this embodiment, the oxide layer that is formed on the substrate is a silicon oxynitride layer. As shown in FIG. 1a, silicon oxynitride layer 105 is formed on substrate 100, and high-k dielectric layer 110 is formed on silicon oxynitride layer 105. Substrate 100 may comprise any material that may serve as a foundation upon which a semiconductor device may be built.

Silicon oxynitride layer 105 preferably is less than about 15 angstroms thick, and more preferably is between about 5 angstroms and about 10 angstroms thick. Silicon oxynitride layer 105 may be formed on substrate 100 in a conventional manner. For example, a chemically or thermally grown silicon dioxide layer may be formed on substrate 100 followed by applying a high temperature rapid thermal anneal in an ammonia or nitrous oxide containing ambient to form silicon oxynitride layer 105. The amount of nitrogen added to the silicon dioxide film should be controlled to generate a silicon oxynitride layer that will be reliable, while ensuring acceptable transistor performance.

High-k dielectric layer 110 may comprise hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form such a high-k dielectric are described here, that dielectric may be made from other materials that serve to reduce gate leakage.

High-k dielectric layer 110 may be formed on silicon oxynitride layer 105 using a conventional deposition method, e.g., a conventional CVD, low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between silicon oxynitride layer 105 and dielectric layer 110. The CVD reactor should be operated long enough to form a layer with the desired thickness. In most applications, dielectric layer 110 should be less than about 40 angstroms thick, and more preferably between about 5 angstroms and about 30 angstroms thick.

After forming high-k dielectric layer 110, capping layer 115 may be formed on layer 110 to generate the FIG. 1b structure. Capping layer 115 may comprise a barrier layer or a sacrificial layer. When capping layer 115 comprises a barrier layer, a gate electrode (which may be derived from polysilicon or one or more metal layers) may subsequently be formed upon capping layer 115. When capping layer 115 comprises a sacrificial layer, capping layer 115 will be removed prior to forming a gate electrode on the gate dielectric. When a barrier layer, capping layer 115 may comprise a metal nitride layer (e.g., a titanium nitride layer) that is between about 10 angstroms and about 25 angstroms thick. When a sacrificial layer, capping layer 115 may comprise, for example, a silicon layer or a titanium nitride layer that is between about 10 angstroms and about 50 angstroms thick. Conventional CVD or PVD processes may be used to form capping layer 115.

After forming capping layer 115 on high-k dielectric layer 110, silicon oxynitride layer 105 and high-k dielectric layer 110 are annealed to create gate dielectric 120, as shown in FIG. 1c. (Capping layer 115 is omitted from FIG. 1c so as not to obscure the invention.) Silicon oxynitride layer 105 and high-k dielectric layer 110 should be annealed at a sufficient temperature for a sufficient time to generate a gate dielectric with a graded dielectric constant. In a preferred embodiment, silicon oxynitride layer 105 and high-k dielectric layer 110 are annealed at a temperature of at least about 800° C. for at least about 30 seconds in a chemically inactive environment, e.g., in a nitrogen or argon ambient. In a particularly preferred embodiment, silicon oxynitride layer 105 and high-k dielectric layer 110 are annealed at a temperature that is between about 800° C. and about 1,100° C. for between about 30 seconds and about 5 minutes.

Such a high temperature rapid thermal anneal should cause high-k dielectric layer 110 and silicon oxynitride layer 105 to inter-diffuse. As a result, the composition of gate dielectric 120 may be like silicon oxynitride at interface 125, like the high-k dielectric layer at surface 130, and like a graded silicate in between. If, for example, high-k dielectric layer 110 comprises hafnium oxide, the anneal should ensure that gate dielectric 120 comprises a $HfSiO_x$ silicate in which the ratio of hafnium to silicon within gate dielectric 120 gradually increases from interface 125 to its upper surface 130.

Figure 2A:
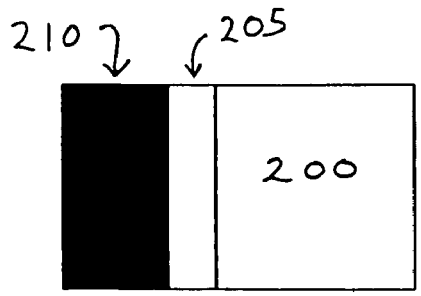
FIGS. 2a–2b illustrate how an electric field across a conventional structure may compare to an electric field across the FIG. 1c structure.
Figure 2A:
Figure 2A:
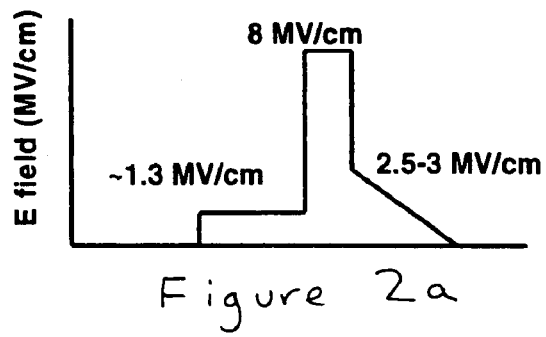
Figure 2B:
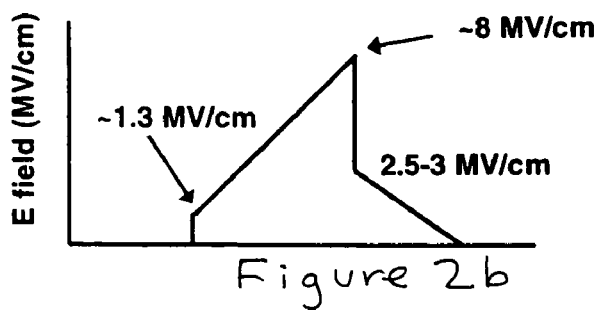

FIGS. 2a–2b illustrate how an electric field across a conventional structure may compare to an electric field across the FIG. 1c structure. When Vcc of 1.0V is applied to a gate dielectric with a conventional structure—formed on silicon substrate 200—and an Etox of about 13.5 angstroms, the electric field across silicon oxynitride layer 205 may be about 8 MV/cm, compared to an electric field across high-k dielectric layer 210 of about 1.3 MWcm—as FIG. 2a illustrates. Because a significant part of the gate dielectric is exposed to a relatively high electric field, the gate dielectric may be unreliable.

In contrast, when a similar voltage is applied to a gate electrode of similar thickness, but which has a graded dielectric constant, the electric field may decrease across the gate dielectric from 8 MV/cm to 1.3 MV/cm in a gradual fashion—as FIG. 2b illustrates. Because a relatively minor portion of gate dielectric 120 is exposed to a relatively high electric field, gate dielectric 120 should be more reliable. Taking as an example a hafnium containing dielectric, the FIG. 2b structure represents a gate dielectric that does not include hafnium at the interface between gate dielectric 120 and substrate 100. In some cases, it may be desirable to increase the hafnium concentration at that location to ensure that the electric field at that interface is less than the 8 MV/cm of FIG. 2b.

When capping layer 115 comprises a barrier layer, e.g., one comprising titanium nitride, it may ensure that the underlying dielectric film remains amorphous as it is annealed, which may be desirable. In addition, such a barrier layer may serve as a diffusion barrier between the gate dielectric and a gate electrode to be formed on it. When capping layer 115 is a sacrificial layer, it may getter impurities from the underlying high-k dielectric layer during the anneal. Removing impurities from the high-k dielectric layer may enhance compatibility between the resulting gate dielectric and a subsequently formed gate electrode. After the anneal step, such a sacrificial layer may be removed, e.g., by applying a wet etch process that is selective for the sacrificial layer over the underlying gate dielectric.

Although not shown, after the anneal step conventional techniques may be used to deposit a polysilicon layer (from which a gate electrode may be derived) onto the barrier layer—or directly on the gate dielectric if capping layer 115 comprises a sacrificial layer. Such a polysilicon layer and underlying layers may then be etched, followed by siliciding all or part of the polysilicon layer in the conventional manner. Alternatively, a metal gate electrode may be formed on the barrier layer, or directly on the gate dielectric. As such steps are well known to those skilled in the art, they will not be described in more detail here.

In the embodiments described above, capping layer 115 comprises a barrier or sacrificial layer that is formed on high-k dielectric layer 110 prior to forming a gate electrode material on the barrier layer or the dielectric layer. Alternatively, capping layer 115 may comprise an n-type or p-type metal layer, from which a metal gate electrode may be made, that is deposited directly on high-k dielectric layer 110 without first forming a barrier or sacrificial layer on that dielectric layer. If capping layer 115 comprises an n-type metal layer, from which an NMOS metal gate electrode may be formed, capping layer 115 preferably has a workfunction that is between about 3.9 eV and about 4.2 eV. N-type materials that may be used to form such an n-type metal layer include hafnium, zirconium, titanium, tantalum, aluminum, and metal carbides that include these elements, i.e., titanium carbide, zirconium carbide, tantalum carbide, hafnium carbide and aluminum carbide. Such an n-type metal layer may be formed on high-k dielectric layer 110 using a conventional CVD or PVD process, and should be thick enough to ensure that any material formed on it will not significantly impact its workfunction. Preferably, such an n-type metal layer is between about 20 angstroms and about 2,000 angstroms thick, and more preferably is between about 100 angstroms and about 300 angstroms thick.

If capping layer 115 comprises a p-type metal layer, capping layer 115 preferably has a workfunction that is between about 4.9 eV and about 5.2 eV. P-type materials that may be used to form such a p-type metal layer include ruthenium, palladium, platinum, cobalt, nickel, or a conductive metal oxide, e.g., ruthenium oxide. Such a p-type metal layer may be formed on high-k dielectric layer 110 using a conventional PVD or CVD process, preferably is between about 20 angstroms and about 2,000 angstroms thick, and more preferably is between about 100 angstroms and about 300 angstroms thick.

In this alternative embodiment, it may be desirable to perform the anneal step prior to forming the capping layer (from which a metal gate electrode will be derived) on high-k dielectric layer 110—depending upon the composition of the metal layer to be formed on the dielectric layer. For example, if capping layer 115 comprises an n-type metal that cannot tolerate high temperatures, it may be necessary to perform the anneal step prior to forming capping layer 115 on high-k dielectric layer 110.

Figure 3A:
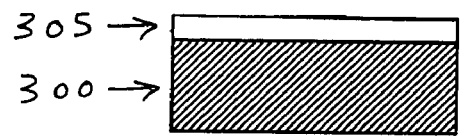
FIGS. 3a–3b represent cross-sections of structures that may be formed when carrying out another embodiment of the method of the present invention.
Figure 3B:
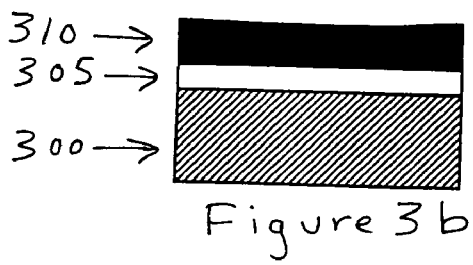

FIGS. 3a–3b represent cross-sections of structures that may be formed when carrying out another embodiment of the method of the present invention. In this embodiment, silicon dioxide layer 305 is formed on substrate 300, as FIG. 3a illustrates. Silicon dioxide layer 305 preferably is less than about 10 angstroms thick, and more preferably is between about 5 angstroms and about 10 angstroms thick. When substrate 300 comprises a silicon wafer, silicon dioxide layer 305 may be chemically grown as follows. First, the silicon wafer is exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants. This process for cleaning a silicon wafer may generate a chemically grown silicon dioxide layer of the desired thickness.

After forming silicon dioxide layer 305, high-k dielectric layer 310 is formed on layer 305, generating the FIG. 3b structure. Materials and processes identified above may be used to make high-k dielectric layer 310. Silicon dioxide layer 305 and high-k dielectric layer 310 are then annealed by exposing them to ammonia at a temperature of at least about 650° C. for at least about 1 minute. In a preferred embodiment, silicon dioxide layer 305 and high-k dielectric layer 310 are exposed to ammonia at a temperature that is between about 650° C. and about 900° C. for between about 1 minute and about 10 minutes. To effect such an anneal, a silicon wafer covered with silicon dioxide layer 305 and high-k dielectric layer 310 may be placed in an enclosed chamber, then exposed to ammonia that is fed into the chamber at about 500 sccm (along with nitrogen delivered at 20 slm) for the selected time at the selected temperature. The resulting gate dielectric may have a dielectric constant that varies in a gradual way from its interface with substrate 300 to its upper surface.

The method of the present invention may yield a gate dielectric with a graded dielectric constant. Because a transistor with such a gate dielectric may have a relatively stable threshold voltage, when subjected to an applied field, such a gate dielectric may enable a reliable device. Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming an oxide layer on a substrate, wherein the oxide layer comprises a silicon oxynitride layer that is less than about 15 angstroms thick;
    forming a high-k dielectric layer on the oxide layer;
    forming a capping layer on the high-k dielectric layer;
    annealing the oxide layer, the high-k dielectric layer and the capping layer at a sufficient temperature and for a sufficient time to generate a gate dielectric with a graded dielectric constant; and
    removing the capping layer.

2. The method of claim 1 wherein the high-k dielectric layer is less than about 40 angstroms thick, and comprises a material that is selected form the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

3. The method of claim 1 wherein the silicon oxynitride layer and the high-k dielectric layer are annealed at a temperature of at least about 800° C. for at least about 30 seconds.

4. The method of claim 3 wherein the silicon oxynitride layer and the high-k dielectric layer are annealed at a temperature that is between about 800° C. and about 1,100° C. for between about 30 seconds and about 5 minutes.

5. The method of claim 1 wherein the capping layer is a barrier layer that comprises a metal nitride.

6. The method of claim 1 wherein the capping layer comprises a metal that is selected from the group consisting of hafnium, zirconium, titanium, tantalum, aluminum, a metal carbide, ruthenium, palladium, platinum, cobalt, nickel, and a conductive metal oxide.

7. A method for making a semiconductor device comprising:
    forming a silicon oxynitride layer on a substrate;
    forming a high-k dielectric layer on the silicon oxynitride layer;
    forming a capping layer on the high-k dielectric layer;
    annealing the silicon oxynitride layer and the high-k dielectric layer at a temperature of at least about 800° C. for at least about 30 seconds to generate a gate dielectric with a graded dielectric constant; and
    removing the capping layer after annealing the silicon oxynitride layer and the high-k dielectric layer.

8. The method of claim 7 wherein: the silicon oxynitride layer is less than about 15 angstroms thick; and the high-k dielectric layer is less than about 40 angstroms thick, and comprises a material that is selected form the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

9. The method of claim 7 wherein the capping layer is a barrier layer that comprises titanium nitride.

10. The method of claim 7 wherein the capping layer comprises titanium nitride or silicon.

11. The method of claim 7 wherein the capping layer comprises a metal that is selected from the group consisting of hafnium, zirconium, titanium, tantalum, aluminum, a metal carbide, ruthenium, palladium, platinum, cobalt, nickel, and a conductive metal oxide.

12. A method for making a semiconductor device comprising:
    forming a silicon oxynitride layer on a substrate;
    forming a high-k dielectric layer on said silicon oxynitride layer;
    forming a sacrificial capping layer on said high-k dielectric layer; and
    subsequent to forming said sacrificial capping layer, annealing said silicon oxynitride layer and said high-k dielectric layer at a sufficient temperature and for a sufficient time to generate a gate dielectric with a graded dielectric constant; and
    removing said sacrificial capping layer.

13. The method of claim 12 wherein said high-k dielectric layer is less than about 40 angstroms thick and comprises a material that is selected form the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide and lead zinc niobate.

14. The method of claim 13 wherein said sacrificial capping layer comprises a metal that is selected from the group consisting of a metallic nitride, hafnium, zirconium, titanium, tantalum, aluminum, a metal carbide, ruthenium, palladium, platinum, cobalt, nickel and a conductive metal oxide.

15. The method of claim 12 wherein said gate dielectric with said graded dielectric constant comprises a bottom surface like said silicon oxynitride layer, a top surface like said high-k dielectric layer and a graded silicate in between.

16. The method of claim 12 wherein said sacrificial capping layer is removed by applying a wet etch process that is selective for said sacrificial capping layer over said gate dielectric with said graded dielectric constant.

17. A method for making a semiconductor device comprising:
    forming a silicon oxynitride layer on a substrate; and
    subsequent to forming said silicon oxynitride layer, forming a high-k dielectric layer on said silicon oxynitride layer; and
    subsequent to forming said high-k dielectric layer, forming a capping layer on said high-k dielectric layer; and
    subsequent to forming said capping layer, annealing said silicon oxynitride layer, said high-k dielectric layer and said capping layer at a sufficient temperature and for a sufficient time to generate a gate dielectric with a graded dielectric constant; and
    subsequent to annealing said silicon oxynitride layer, said high-k dielectric layer and said capping layer, removing said capping layer.

18. The method of claim 17 wherein said gate dielectric with said graded dielectric constant comprises a bottom surface like said silicon oxynitride layer, a top surface like said high-k dielectric layer and a graded silicate in between.

19. The method of claim 17 wherein said capping layer is removed by applying a wet etch process that is selective for said capping layer over said gate dielectric with said graded dielectric constant.

20. The method of claim 17 wherein said silicon oxynitride layer, said high-k dielectric layer and said capping layer are annealed a temperature of at least about 800° C. for at least about 30 seconds.

* * * * *